United States Patent
Yang

(10) Patent No.: US 6,641,673 B2
(45) Date of Patent: Nov. 4, 2003

(54) FLUID INJECTOR FOR AND METHOD OF PROLONGED DELIVERY AND DISTRIBUTION OF REAGENTS INTO PLASMA

(75) Inventor: Barry Lee-Mean Yang, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/742,837

(22) Filed: Dec. 20, 2000

(65) Prior Publication Data

US 2002/0136909 A1 Sep. 26, 2002

(51) Int. Cl.⁷ .............................................. C23C 16/00
(52) U.S. Cl. ................... 118/723; 118/715; 118/723 E; 156/345.33
(58) Field of Search ....................... 118/715, 723 E, 118/723 DC; 156/345.33, 345.34

(56) References Cited

U.S. PATENT DOCUMENTS

| | | | |
|---|---|---|---|
| 4,049,523 A | * 9/1977 | Boehnke et al. | 118/715 |
| 5,338,364 A | * 8/1994 | Kurihara et al. | 118/715 |
| 5,679,167 A | * 10/1997 | Muehlberger | 118/620 |
| 5,728,223 A | * 3/1998 | Murakami et al. | 118/715 |
| 5,851,294 A | * 12/1998 | Young et al. | 118/715 |
| 5,950,925 A | * 9/1999 | Fukunaga et al. | 118/715 |
| 5,951,771 A | * 9/1999 | Raney et al. | 118/423 ER |
| 5,962,085 A | * 10/1999 | Hayashi et al. | 118/319 |
| 6,106,625 A | * 8/2000 | Koai et al. | 118/715 |
| 6,110,544 A | 8/2000 | Yang et al. | |
| 6,123,776 A | 9/2000 | Chen et al. | |
| 6,132,552 A | * 10/2000 | Donohoe et al. | 118/723 I |
| 6,170,432 B1 | * 1/2001 | Szapucki et al. | 118/723 E |
| 6,213,049 B1 | * 4/2001 | Yang | 118/723 DC |
| 6,436,193 B1 | * 8/2002 | Kasai et al. | 118/715 |
| 6,444,042 B1 | * 9/2002 | Yang et al. | 118/715 |
| 2002/0136909 A1 | * 9/2002 | Yang | 428/447 |

FOREIGN PATENT DOCUMENTS

| | | | |
|---|---|---|---|
| JP | 62-115827 | * | 5/1987 |
| JP | 11-080963 A | * | 3/1999 |
| JP | 2000 038678 | | 2/2000 |

OTHER PUBLICATIONS

Precision Orifices, O'Keefe Controls Co., Catalog No. 11, p. 11, (1997).

* cited by examiner

Primary Examiner—Jeffrie R. Lund
(74) Attorney, Agent, or Firm—Robert P. Santandrea; Patrick K. Patnode

(57) ABSTRACT

A method and apparatus for injecting a fluid into a plasma stream with a uniform distribution and with reduced likelihood of clogging over prolonged use is provided. An injector includes a first channel portion for restricting a flow of the fluid and having a shape such that inner walls of the first channel portion are parallel to a first axis. The injector also includes a second channel portion in fluid communication with the first channel portion. The second channel portion includes a recessed portion such that inner walls of the second channel portion diverge from the first axis at a predetermined angle. The second channel portion reduces a buildup of a clogging layer on the inner walls of the second channel portion over a period of use. In addition, the injector can further include a tip portion that protrudes into the plasma. The injector can be integrated into or interchangeable within an injector system that can be designed for operation within a plasma deposition apparatus.

47 Claims, 6 Drawing Sheets

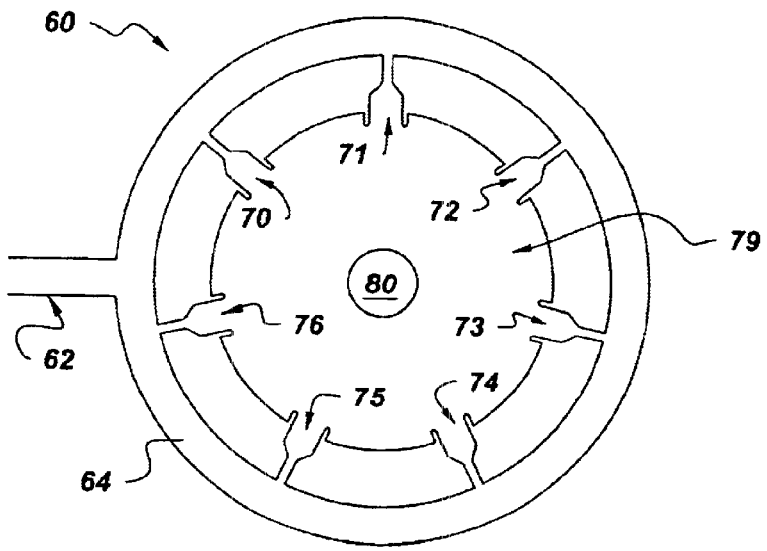
*fig. 6a*
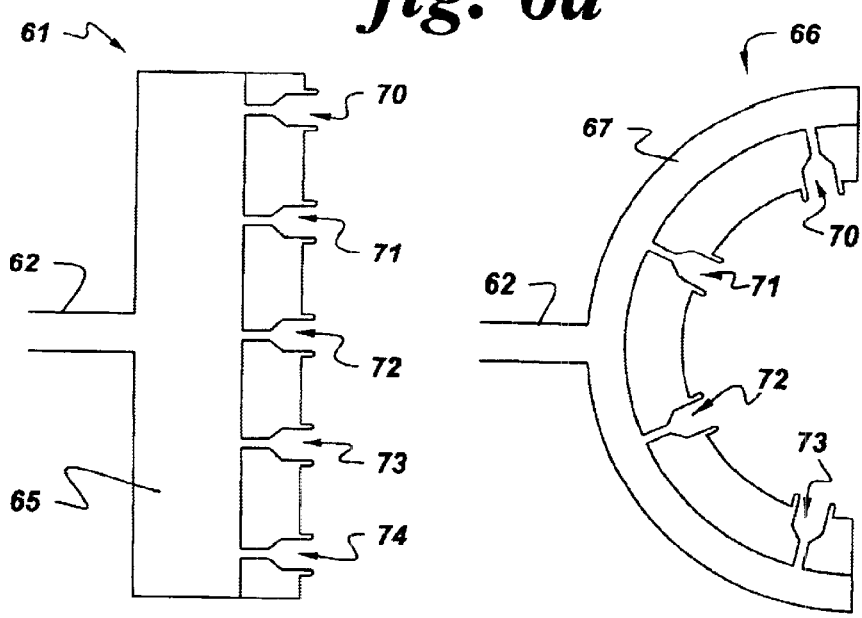
*fig. 6b*     *fig. 6c*

FLUID INJECTOR FOR AND METHOD OF PROLONGED DELIVERY AND DISTRIBUTION OF REAGENTS INTO PLASMA

BACKGROUND OF THE INVENTION

The present invention is directed to an apparatus and method for fluid injection for prolonged delivery and uniform distribution of reagents into plasma. In particular, the present invention is directed to an injector for deposition of protective coatings on various substrates such as glass, quartz, metal or metallized materials, and plastics.

The use of a polycarbonate (PC) sheet or film for outdoor applications such as architectural glazing and automotive glazing requires the PC to be protected from the abrasion effects. Thus, an abrasion resistant coating is conventionally formed on PC.

Various conventional deposition techniques for abrasion resistant coatings have been developed. For example, chemical vapor deposition (CVD), physical vapor deposition (PVD) and plasma-enhanced chemical vapor deposition (PECVD) are widely used. PVD produces solid films by supplying thermal energy to activate the source material for deposition. CVD produces a solid film on a substrate surface by thermal activation and surface reaction of gaseous reagents which contain the desired constituents of the film. Energy required to activate the reactants is supplied by heating the substrate. For reasonable reaction rates the substrate is heated to relatively high temperature, in the range of about 500 to 2000° F. PECVD supplies energy to the reactants by an electrical discharge in a gas which forms a plasma in the deposition chamber. With the help of plasma, substrate heating is no longer needed and low melting point materials such as plastics can be coated in a straightforward manner by using PECVD.

An important component in these deposition systems is the device used to inject reagents, metal vapors, and other source materials into the plasma stream. For example, U.S. patent application No. 09/033,862, filed Mar. 3, 1998 (pending) and U.S. Pat. No. 6,110,544, issued on Aug. 29, 2000 describe a nozzle-injector for high-rate, large-area deposition using an arc plasma.

Conventionally, a series of orifices (also referred to as injectors) evenly distributed over an injector body or plate are used for controlled, uniform delivery of gases or vapors over an area. Such a device is sometimes referred to as a showerhead injector or distributor. High and even flow resistance at every injector is desirable to ensure uniform distribution of an injected reagent throughout all injectors.

For example, a conventional narrow, straight-walled injector is shown in FIG. 2 as injector 20. Often, a reagent interacts with the plasma 18 near the exit aperture, such as aperture 22, and thus reagent is deposited as a solid layer 19 not only at aperture 22, but also along inner wall 24. When utilized in a multi-channel reagent injection device, clogging can occur unevenly among the orifices, thus the uniformity of reagent delivery (and subsequent deposition) is hampered. Also, the performance of the injector can vary as a function of time, and frequent cleaning of the clogged injectors is necessary.

Thus, although a showerhead injector is effective for uniform distribution of reagents, it suffers from a general shortcoming of orifice clogging during prolonged exposure to condensable reagents, especially in the presence of plasma. This occurs because the concentration of the reagent is high at the injector exit aperture, and because the injector is often in contact with the plasma. High reagent concentration combined with plasma activation encourages deposition of a solid film at the injector exit aperture and on the inner walls of the injector. As a result, the injector becomes clogged over time. If clogging occurs unevenly among the injectors, the uniformity of material delivery is hampered. A clogged injector needs to be cleaned or replaced, thus causing process interruption, adding down time and operating cost.

SUMMARY OF THE INVENTION

In view of the foregoing, it would be desirable to provide an apparatus for injecting a fluid into a plasma stream with a uniform distribution and with reduced likelihood of clogging over prolonged use.

The present invention provides an injector system that includes a base containing an injector. The injector comprises an inner wall defining a first channel portion for restricting a flow of the fluid and having a shape such that the inner wall of the first channel portion is parallel to a first axis. The injector also includes an inner wall defining a second channel portion in fluid communication with the first channel portion. The second channel portion includes a recessed portion such that the inner wall of the second channel portion diverges from the first axis at a predetermined angle. The second channel portion reduces a buildup of a clogging layer on the inner wall of the second channel portion over a period of use. In addition, the injector can further include a tip portion that protrudes into the plasma.

In view of the foregoing, it would also be desirable to provide an apparatus for coating a substrate.

According to another embodiment of the present invention, an apparatus for coating a substrate includes a plasma generator having an anode and a cathode capable of forming an arc plasma that travels toward a substrate, a chamber to house the substrate, and a first injector system located between the anode and the substrate for introducing a first reactant into the plasma. The first injector system comprises an injector that includes a first channel portion for restricting a flow of the fluid and having a shape such that inner walls of the first channel portion are parallel to a first axis. The injector also includes a second channel portion in fluid communication with the first channel portion. The second channel portion includes a recessed portion such that inner walls of the second channel portion diverge from the first axis at a predetermined angle. The second channel portion reduces a buildup of a clogging layer on the inner walls over a period of use. In addition, the injector can further include a tip portion that protrudes into the plasma.

In view of the foregoing, it would be desirable to provide a method for injecting a fluid into a plasma stream with a uniform distribution and with reduced likelihood of clogging over prolonged use.

According to another embodiment of the present invention, a method of coating a substrate in a uniform manner comprises supplying a first reactant to an injector system having a plurality of injectors disposed along a circumference of a fluid supply channel, where each of the injectors includes a first channel portion and has an orifice with a diameter sufficient to restrict a flow of the first reactant and a second channel portion being a recessed portion, such that inner walls of the second channel portion diverge from a first axis at a predetermined angle to reduce a buildup of a clogging layer comprising the first reactant on the inner walls. An arc plasma is generated. The first reactant is introduced into the plasma and the first reactant is deposited on a surface of the substrate.

In view of the foregoing, it would be desirable to provide an article having a coating deposited using the apparatus of the present invention.

According to another embodiment of the present invention, a coated article coated by the apparatus of the present invention comprises a substrate having a surface and at least one coating deposited by plasma assisted chemical vapor deposition on the surface.

Further features and advantages of the invention, as well as the structure and operation of various embodiments of the invention, are described in detail below with reference to the accompanying drawings.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the pertinent art to make and use the invention.

FIG. 6A shows an injector system having multiple injectors arranged in a ring-shaped assembly according to another embodiment of the present invention.

FIGS. 6B and 6C show alternative injector systems having multiple injectors arranged in planar and semi-circular shapes, according to alternative embodiments of the present invention.

DETAILED DESCRIPTION OF THE PREFERRED EMBODIMENTS

The present inventor has discovered that conventional, straight-hole channels used in injecting fluids, such as reagent gases, into an arc plasma are susceptible to severe clogging problems. These clogging problems can be overcome or at least reduced according to the present invention by utilizing an injector having a recessed portion and, optionally, a protruding tip portion that extends into a plasma stream or flow.

Figure 1:
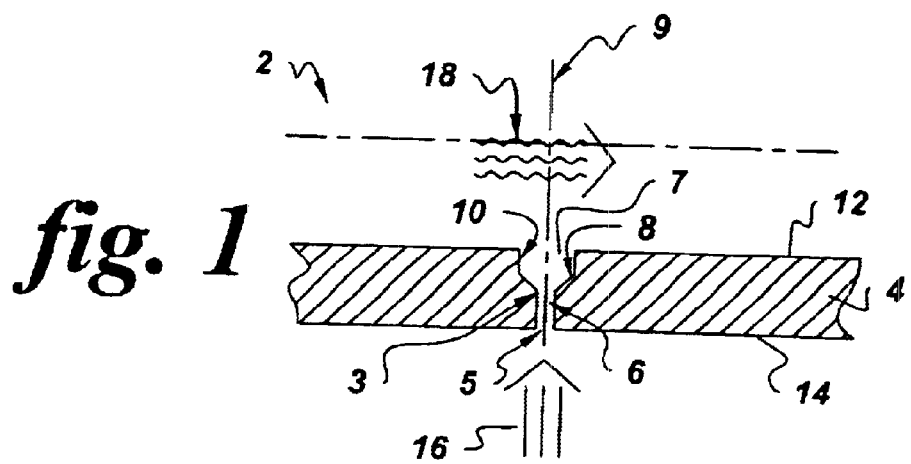
FIG. 1 shows a cross section view of an injector having a recessed portion according to one embodiment of the present invention.

FIG. 1 shows a cross sectional side view of an injector 2 according to the first embodiment of the present invention. As shown in FIG. 1, an injector 2 is integrally disposed in an injector plate or base 4. The material forming plate or base 4, as well as the inner walls 3 of the injector 2, can be any material suitable for plasma chamber deposition applications. For example, base 4 can comprise a stainless steel body, or any other metal, such as nickel, or other metal alloys such as MONEL™ (registered to Inco Alloys International) or HASTELLOY™ (registered to Haynes International), that can withstand high operating temperatures without melting. Alternatively, base 4 can comprise a ceramic or the like, which can withstand extremely high operating temperatures.

In this aspect of the first embodiment of the present invention, injector 2 is integrally formed in base 4. In addition, base 4 can be a generally planar base. Alternatively, base 4 can be configured in a ring shape having a plurality of injectors (as described below). Other specific shapes for base 4 can be designed in accordance with the present invention, as would be apparent to one of ordinary skill in the art.

As illustrated in FIG. 1, the injector 2 has an entrance aperture 5 formed in base surface 14 and an exit aperture 7 formed in base surface 12. A first portion 6 of injector 2 is preferably cylindrical in shape, such that the walls of first portion 6 are parallel to the first axis 9. Alternatively, a cross-section of the first portion 6 of injector 2 can have any polygonal shape. A second portion 8 of injector 2 is a recessed portion, where the walls diverge from the first axis 9 at a predetermined angle. This predetermined angle can range from 10 degrees (with respect to axis 9) to almost 90 degrees. According to a preferred embodiment, the predetermined angle can range from about 20 degrees to about 70 degrees. In this embodiment, second portion 8 is preferably conical in shape.

A third portion 10 of injector 2 forms an exit aperture 7. Portion 10 can be cylindrical in shape, as shown in FIG. 1, but with a larger diameter than portion 6. Alternatively, the cross-section of portion 10 can have any polygonal shape. In addition portion 10 can alternatively be divergent from axis 9. The angle of divergence of the inner walls 3 from axis 9 can range from zero degrees to near 90 degrees. In addition, the divergence angle of portion 10 can be the same or different than the divergence angle of portion 8. Portions 6, 8, and 10, can be fabricated in base 4 by conventional machining techniques, as would be apparent to one of ordinary skill in the art given the present description.

In operation, a fluid, such as a reagent, gas, or vapor flows from region 16, through aperture 5 into injector 2, and exits aperture 7 into a plasma cloud, or stream 18. The direction of flow of plasma stream 18 can be longitudinal (in either direction) along injector plate 4 or transverse (i.e., into or out of the drawing). Thus, injector 2 can separate plasma from a reagent at high pressure.

Figure 2:
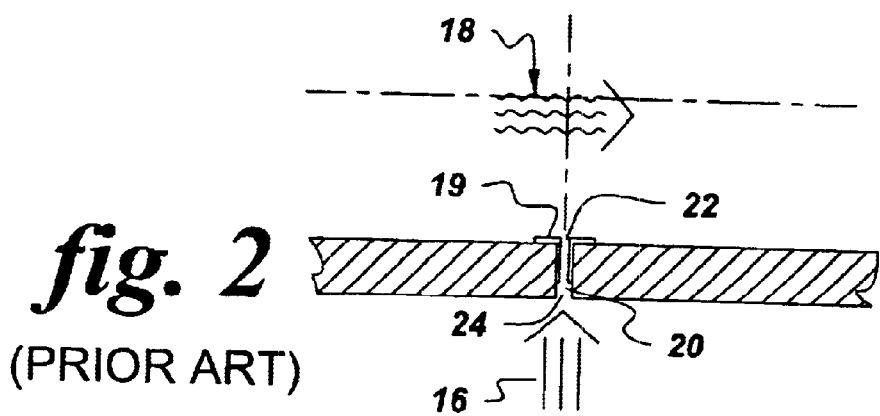
FIG. 2 shows a cross section view of an injector having a straight hole channel.

A small diameter orifice, such as channel 20 shown in FIG. 2, can provide high flow-resistance. This flow-resistance is useful for an even distribution of the reagent into the plasma stream. However, unlike the conventional (straight-hole) channel 20, shown in FIG. 2, the recessed portion 8 of injector 2 shown in FIG. 1 reduces direct exposure of portion 6 to the plasma.

As mentioned above, a conventional injector, such as injector 20 from FIG. 2, is susceptible to clogging over time, where a buildup of film 19 occurs at exit aperture 22 and inner wall 24. Thus, when utilized in a multi-injector device, clogging can occur unevenly and the uniformity of reagent delivery (and subsequent deposition) is hampered.

Figure 3:
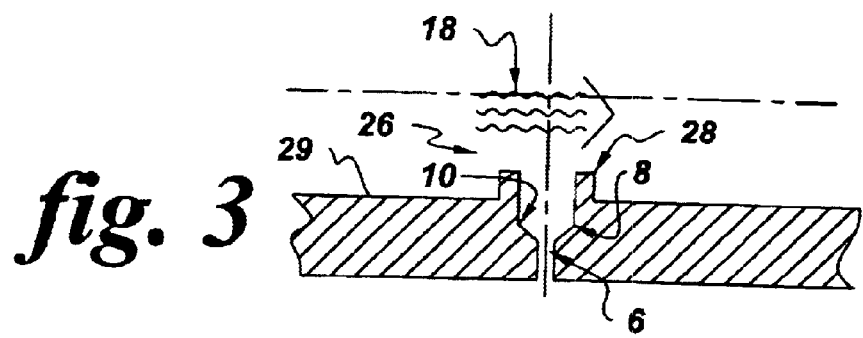
FIG. 3 shows a cross section view of an injector having a recessed portion and a protruding tip according to another embodiment of the present invention.

According to another embodiment of the present invention, illustrated in FIG. 3, an injector 26 can include a recessed portion 8, and a tip portion 28 that protrudes beyond base surface 29 into the plasma stream 18. Tip portion 28 can extend a few thousandths of an inch to tens of an inch beyond surface 29, and into the plasma stream. According to the present invention, injector 26 provides for an improved dispersion of the reagent into the plasma stream 18. Injector portions 6, 8, and 10 can be designed similar to that discussed above with respect to FIG. 1, where portion 6 has a smaller diameter than recessed portion 8 and portion 10. In addition, as explained below in the experiment section, the design of injector 26 provides a greater reduction in clogging after repeated use over the design of the conventional injector 22 shown in FIG. 2.

Figure 4:
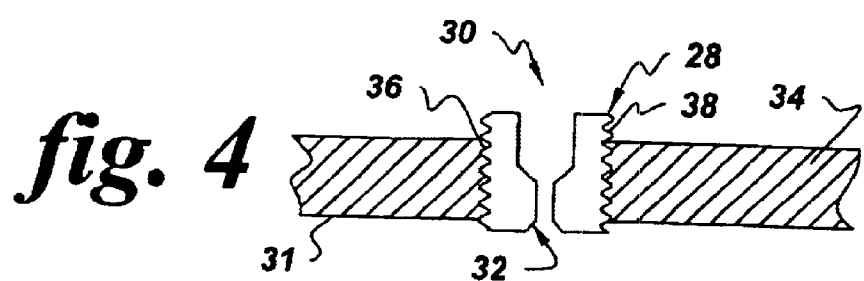
FIG. 4 shows a cross section view of an interchangeable injector having a recessed portion and a protruding tip according to another embodiment of the present invention.

According to yet another aspect of this embodiment of the present invention, an injector 30 can be designed with removable inserts of different channel diameters, different recessed portions having different divergent angles from the first axis, and different distances of tip protrusion into the plasma stream. For example, as shown in FIG. 4, injector 30, having a recessed portion 8 and a protruding portion 28 similar to those described above, insertable into and removable from injector base 34. Base 34 includes a threaded portion 36 that matches the threaded portion 38 of injector 30. Alternatively, injector 30 can have a smooth outer surface and base 34 can be designed to provide a snug, form fit or friction fit receptacle for injector 30, as would be apparent to one of ordinary skill in the art given the present description. In addition, injector 30 can optionally further include a divergent portion 32 that protrudes below base surface 31. Thus, different types of injectors can be utilized in plate 34 for different applications. With such a design, the injector can be easily customized for different processes.

Figure 5A:
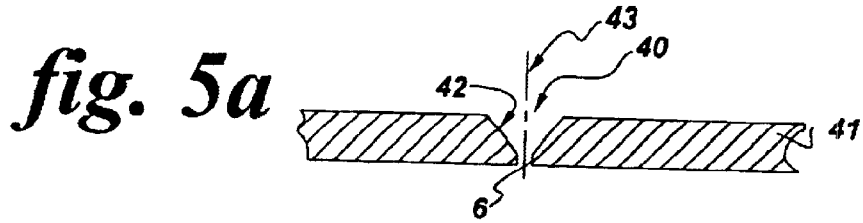
FIGS. 5A–5E show cross section views of various injector embodiments according to alternative embodiments of the present invention.

Several additional embodiments of injector designs are shown in FIGS. 5A–5E. In FIG. 5A, an injector 40 is integrally formed in base 41. Injector 40 includes a first portion 6 that can be cylindrical in shape, such that the walls of first portion 6 are parallel to an axis 43. A second portion 42 of injector 40 is a recessed portion, where the walls diverge from the cylindrical axis at a predetermined angle. Note that a third, generally cylindrical portion is omitted from this design. Alternatively, injector 40 can be modified to be an interchangeable insert in base 41, similar to the interchangeable injector described above with respect to FIG. 4.

Figure 5B:
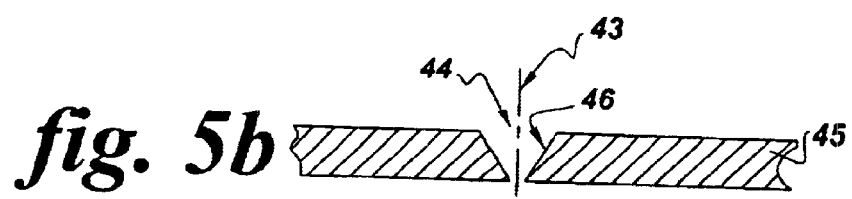

In FIG. 5B, injector 44 is integrally formed in base 45. A first portion 46 of injector 44 is a recessed portion, where the walls diverge from the axis 43 at a predetermined angle. Note that injector 44 does not include generally cylindrical portions. Alternatively, injector 44 can be modified to be an interchangeable insert in base 45, similar to the interchangeable injector described above with respect to FIG. 4.

Figure 5C:
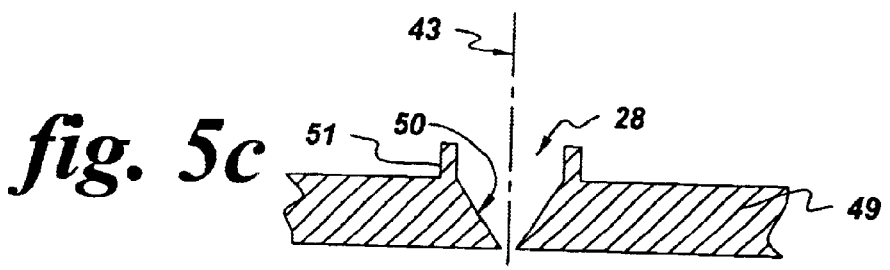

In FIG. 5C, injector 48 is integrally formed in base 49. A first portion 50 of injector 48 is a recessed portion, where the walls diverge from the axis 43 at a predetermined angle. A second portion of injector 48 is defined by cylindrical tip portion 51 that protrudes beyond the top surface of base 49 into the plasma or plasma flow. Similar to injector 26 described above with respect to FIG. 3, tip portion 51 can extend a few thousandths of an inch to tens of an inch beyond the top surface of plate 49 and into the plasma stream. Alternatively, injector 48 can be modified to be an interchangeable insert in base 49, similar to the interchangeable injector described above with respect to FIG. 4.

Figure 5D:
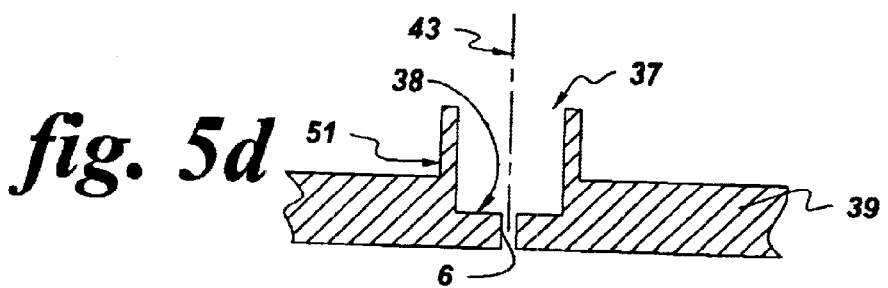

In FIG. 5D, injector 37 is integrally formed in base 39. Injector 37 includes a first portion 6 that is cylindrical in shape, such that the walls of first portion 6 are parallel to the axis 43. A second portion 38 of injector 37 is cylindrical in shape, having a diameter larger than a diameter of portion 6. In this embodiment, the inner walls of portion 6 and portion 38 are parallel to one another.

Figure 5E:
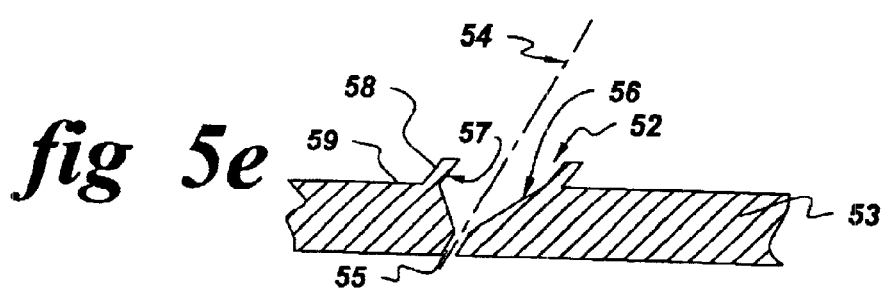

In the aspect of this embodiment of the present invention shown in FIG. 5E, injector 52 is disposed at an acute angle with respect to the top surface 59 of base 53. As shown in FIG. 5E, injector 52 is integrally formed in base 53. Injector 52 includes a first portion 55 that is cylindrical in shape, such that the walls of first portion 55 are parallel to axis 54, which is inclined at an acute angle of with respect to top surface 59. The incline angle can be from about 10 degrees to about 70 degrees, and is preferably about 30 degrees to about 60 degrees. A second portion 56 of injector 52 is a recessed portion, where the walls diverge from the axis 54 at a predetermined angle. A third portion 57 of injector 52 can be cylindrical in shape or can be divergent from axis 54. A tip portion 58 protrudes beyond the top surface 59 of base 53 into the plasma or plasma flow. Similar to injector 26 described above with respect to FIG. 3, tip portion 58 can extend a few thousandths of an inch to tenths of an inch beyond the top surface of plate 53 and into the plasma stream. Alternatively, injector 52 can be modified to be a removable and interchangeable insert in base 53, as would be apparent to one of ordinary skill in the art, given the present description.

FIG. 6A shows another embodiment of the present invention, an injector system having multiple injectors arranged in a ring-shaped assembly. A fluid supply line 62 connects to fluid supply channel 64 formed inside the body of injector system 60. Fluid supply channel 64 contains a plurality of injectors 70–76, which are preferably evenly distributed around the circumference of channel 64. Each of the injectors 70–76 can be designed in accordance with the different injector embodiments described in detail above with respect to FIGS. 1, 3, 4, and 5A–5E. For example, one or more of injectors 70–76 can include a recessed portion, and, optionally, a protruding tip to further reduce the likelihood of clogging. The fluid flows from line 62 into the channel 64. The fluid then flows from the channel 64 simultaneously through injectors 70–76 into a deposition chamber space 79 from several directions. In this embodiment of the present invention, injector system 60 includes one or more injectors coupled to a reactant supply line or lines providing for the delivery of the fluids into the plasma. Alternatively, as discussed below, the injector system does not have to be ring shaped, but can be designed as a planar cylinder having multiple injectors (FIG. 6B), or in a semi circular shape (FIG. 6C). Multiple injectors can be distributed over the area of an injector plate of different geometry, such as a round disk, a square, a rectangle, a triangle, or a trapezoid, to best fit the design of a deposition chamber for substrates of different shapes.

In a preferred embodiment, the plasma is supplied from the exit of a plasma generator 80, such as a DC arc. The plasma can flow into or out of the page as shown in FIG. 6A.

The fluids are supplied into the fluid supply channel 64 through supply line 62. Furthermore, one or more additional supply lines can be connected to injector system 60 to provide additional fluids, such as reactants and/or dopants, to the plasma stream. According to this embodiment of the present invention, the selected fluid is preferably a reactant which is transported by a plasma to react and form a coating on a substrate. The particular fluid utilized is application dependent, but can include, without limitation, inorganic gases, inorganic compound gases, organic compound gases, and organo-metallic compound gases. The inorganic gases can include elemental gases such as oxygen, nitrogen, and hydrogen, vaporized metals such as zinc, aluminum, indium, and compounds thereof. The inorganic compound gases can include ammonia, silane, and compounds thereof. The organic compound gases can include hydrocarbons (e.g. methane, butadiene, ethylbenzene), organosilanes (e.g. hexamethyldisilane, tetramethyldisilane, vinyltriethylsilane), organosiloxanes (e.g. hexamethyldisiloxane, tetramethyldisiloxane, octamethylcyclotetrasiloxane), organosilazanes (e.g. hexamethyldisilazane), and compounds thereof. The organo-metallic compound gases can include diethylzinc, dimethylzinc, and compounds thereof.

In a preferred aspect of this embodiment, reactants are utilized to form a scratch resistant coating, such as alumina ($Al_2O_3$), silicon dioxide ($SiO_2$), diamond-like carbon, or a plasma polymerized siloxane coating, on a polycarbonate substrate, as described in pending U.S. application Ser. No. 09/271,658, to Charles Iacovangelo, et al., filed Mar. 17, 1999.

FIGS. 6B and 6C show alternative injector systems having multiple injectors arranged planar and semi-circular shapes, respectively, according to alternative embodiments of the present invention. In FIG. 6B, a fluid supply line 62 connects to fluid supply channel 65 formed inside the body of injector system 61. Fluid supply channel 65 has a generally cylindrical shape and contains a plurality of injectors 70–74. Each of openings 70–74 can be designed in accordance with the different injector embodiments described in detail above. For example, one or more of injectors 70–74 can include a recessed portion, and, optionally, a protruding tip to further reduce the likelihood of clogging.

Alternatively, in FIG. 6C, a fluid supply line 62 connects to fluid supply channel 67 formed inside the body of injector system 66. In this aspect of the invention, fluid supply channel 67 has a semicircular shape and contains a plurality of injectors 70–73, designed in accordance with the different injector embodiments described in detail above. Other variations and modifications as to the shape of the injector system can be designed depending on the type of fluid injection required for a particular application, as would be apparent to one of ordinary skill in the art, given the present description.

Figure 7:
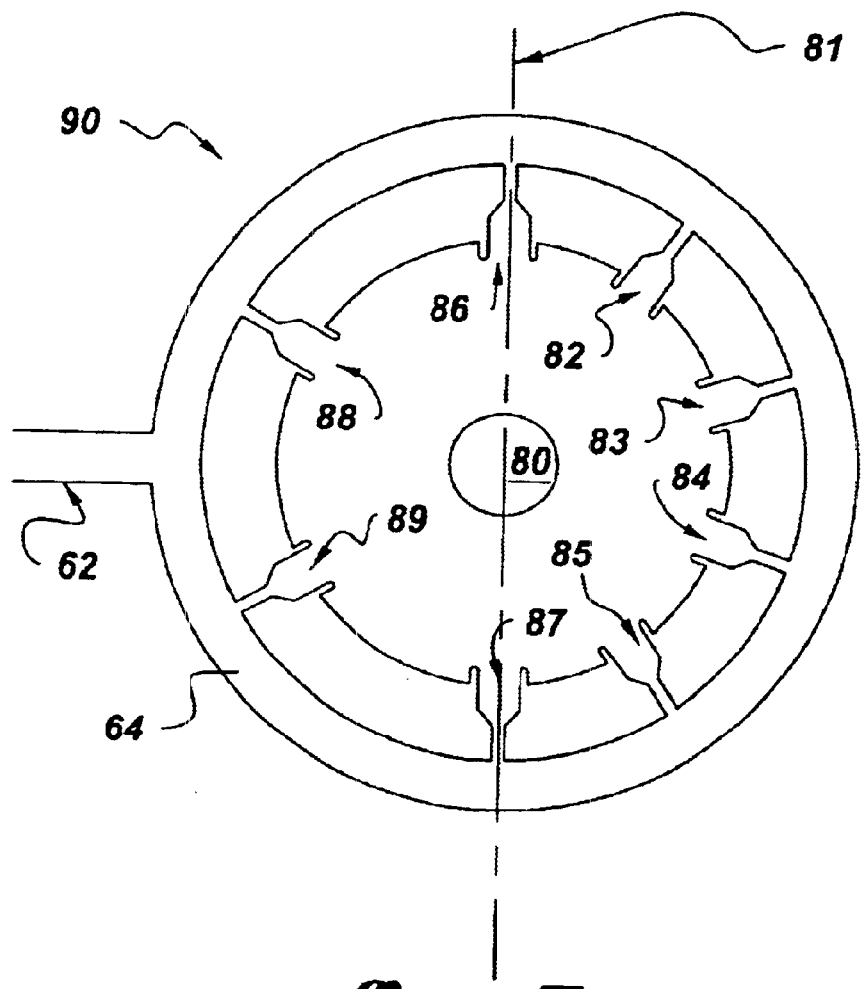
FIG. 7 shows an alternative injector system having a non-uniform distribution of multiple injectors arranged in a ring-shaped assembly, according to another embodiment of the present invention.

FIG. 7 shows another aspect of the injector system embodiment shown in FIG. 6A. Here, injector system 90 includes a fluid supply channel 64 that is coupled to a fluid supply line 62 and a plurality of injectors 82–89. In this aspect of the invention, uniform delivery of fluid into deposition chamber space 80 is further enhanced by locating a greater number of injectors on the side opposite of supply line 62 (to the right of axis 81 in FIG. 7). In the example shown in FIG. 7, four injectors are located to the right of axis 81 and two injectors are located to the left of axis 81. In addition, the size of the individual injectors 82–89 can be designed such that greater fluid restriction occurs on the side closest to fluid supply line 62 (to the left of axis 81 in FIG. 7) than on the side furthest from supply line 62. In this example, the injectors on the right of axis 81 shown in FIG. 7 can have entrance diameters larger than the entrance diameters for the injectors to the left of axis 81. In addition, the injectors can be designed in accordance with the different injector embodiments described in detail above.

Figure 8:
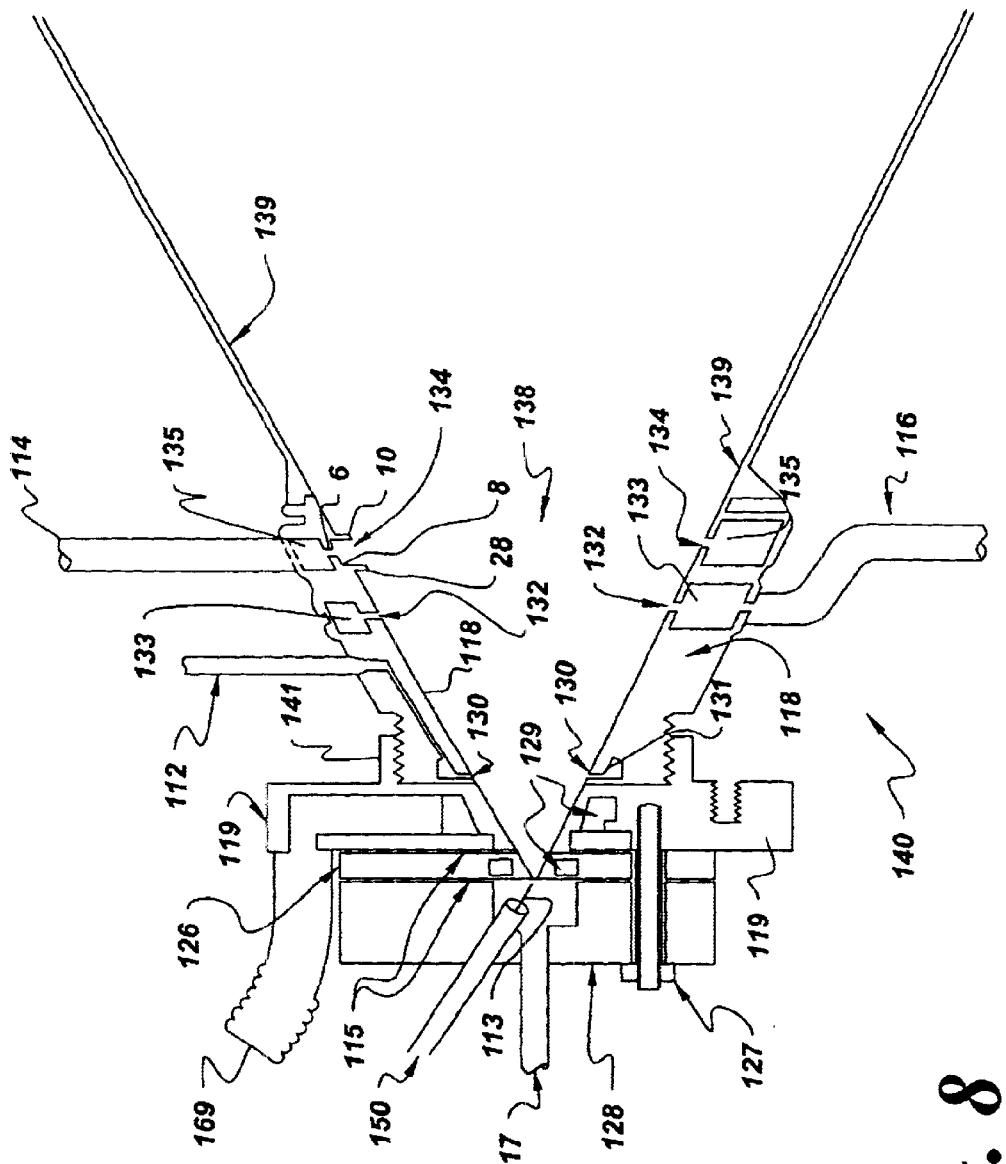
FIG. 8 shows a plasma arc device utilizing an injector system according to another embodiment of the present invention.

FIG. 8 shows an arc plasma generator 140 according to another embodiment of the present invention. The plasma generator 140 contains at least one cathode 113, a plasma gas supply line 117 and an anode nozzle 119. Generator 140 preferably comprises more than one cathode 113. Advantageously, there are three cathodes 113. The cathodes 113 may comprise, for example, tungsten or thorium doped tungsten tips. The use of thorium allows the temperature of the tips to be maintained below the melting point of tungsten, thus avoiding contamination of the plasma with tungsten atoms. The cathodes 113 may be supported by a cathode housing 150 to isolate each cathode 113 from the walls of the cathode support plate 128.

The cathodes 113 are preferably separated from the anode nozzle 119 by at least one cascade plate 126. The cascade plate(s) preferably comprise copper discs containing a central aperture. The diameter of the central aperture preferably expands at a constant rate from the cathodes 113 to the anode nozzle 119 aperture. However, other configurations may be used.

Generator 140 also contains at least one plasma gas supply line 117. Optionally, generator 140 may also contain a purging gas supply line adjacent to the plasma gas supply line 117 to supply a purging gas to chamber 140 and the deposition chamber (not shown) prior to supplying a plasma gas.

A cathode support plate 128 may suitably be attached to the cascade plate(s) 126 and the anode nozzle 119 by an insulated bolt 127 or by other fasteners. The cascade plate(s) 126 is(are) preferably electrically insulated from the cathode support plate 128 and the anode nozzle 119 by spacers 115. Spacers 115 may comprise, for example, O-ring vacuum seals, polyvinylchloride rings and/or boron nitride rings.

Plasma discharge at high power density and high temperature tends to heat the cascade plate(s) 126 and the anode nozzle 119. Preferably, the cascade plate(s) 126 and the anode nozzle 119 contain cooling water channels 129. Preferably, the channel 129 has a circular shape within the inside volume of the plate(s) 126 and the nozzle 119. Chilled water supplied through a water supply line 169 flows through the channel 129 to cool the plate(s) 126 and the nozzle 119.

The arc plasma generator 140 may also include an injection nozzle 118, which further comprises one or more inlets that comprise the injector systems according to the embodiments described herein. Preferably, the nozzle 118 has a conical shape with a divergent angle of about 10 degrees to about 60 degrees, preferably about 40 degrees to about 50 degrees, and a length of about 10 cm to about 20 cm, preferably about 16 cm. However, nozzle 118 may have a variable cross section, such as conical-cylindrical-conical or conical-cylindrical. The injection nozzle 118 is preferably attached to the anode nozzle 119. The injection nozzle 118 contains an optional integral or removable divergent extension portion 139 for directing the plasma and reactive species flow. The location of the injector systems can be chosen corresponding to a desired chemical stoichiometry and structure of the coating to be coated onto the surface of a substrate by the plasma.

The coating apparatus also contains at least one reactant supply line. For example, three reactant supply lines 112, 114, 116 illustrated in FIG. 8 preferably communicate with the injection nozzle 118 and supply reactants into the plasma flowing through the nozzle 118. However, there may be one, two, three, or more than three reactant supply lines. Furthermore, the reactant supply lines may be located over the anode aperture 119 or inside the deposition chamber adjacent to the plasma generator.

The injection nozzle 118 preferably contains a circular injector system which comprises at least one ring shaped reactant supply channel connected to injectors, such as ring injector 60 shown in FIG. 6A. For example, a reactant supply line 114 connects to reactant supply channel 135 formed inside the body of the injection nozzle 118. Reactant supply channel 135 generally contains a plurality of injectors 134, which are preferably evenly distributed around the circumference of channel 135.

In addition, injectors 134 are preferably designed according to the injector shapes described above. For example, as shown in FIG. 8, a reactant from supply line 114 would flow into supply channel 135, and to injector 134. Injector 134 can include a first channel portion 6, a second channel portion 8 that is a recessed portion having a diverging diameter larger than channel portion 6, a third channel portion 10, and a tip portion 28, similar to injector 26 shown above in FIG. 3. Thus, the reactant would flow from the channel 135 simultaneously through injectors 134 to enter the plasma 152 (shown in FIG. 9) emanating from anode nozzle 119 into the deposition chamber from several directions. Likewise, supply line 116 is connected to channel 133 and injectors 132, and supply line 112 is connected to channel 131 and injectors 130. According to the several embodiments of the present invention, clogging of injectors 130, 132, and 134 is reduced.

Figure 9:
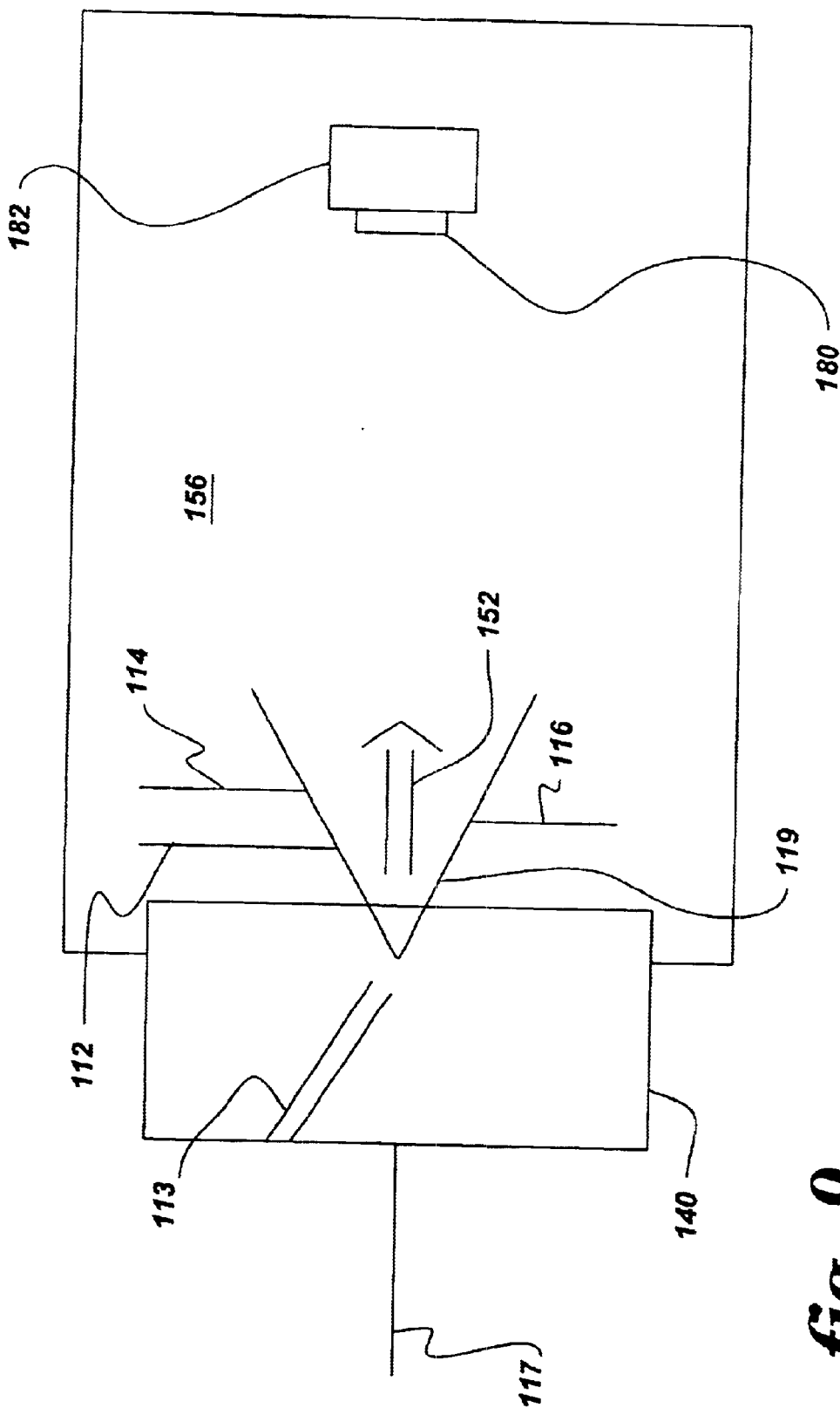
FIG. 9 shows a plasma arc device having a plasma generating chamber and a deposition chamber according to another embodiment of the present invention.

A method of generating a plasma and forming a layer on a substrate 180 will now be described with reference to FIG. 9. To form a plasma in generator 140, a plasma gas is supplied through plasma gas supply line 117. The plasma gas may suitably comprise a noble gas, such as argon or helium, or a mixture of gases with components such as nitrogen, carbon dioxide or hydrogen. If there is more than one plasma gas, then the plural gases may be supplied through plural supply lines, if desired. Preferably, the plasma gas comprises argon or an argon-containing mixture. The plasma gas in plasma generator 140 is maintained at a higher pressure than that of the ambient in the deposition chamber 156, which is continuously evacuated by a pump (not shown). A DC voltage is then applied between the cathode(s) 113 and the anode nozzle 119 to generate a plasma 152 in the generator 140. The plasma then extends as a plasma stream 152 through the anode nozzle 119 aperture into the deposition chamber due to the pressure difference.

The reactant(s) are supplied into the plasma stream through supply line(s) 112, 114 and/or 116. The reactants may be supplied through a supply line in the form of a gas or liquid which disassociate in the plasma stream. A coating can then be deposited on substrate 180, which is supported by a substrate mount 182. Alternatively, reactants, such as metal, and semiconductor reactants, may be supplied in the form of a vapor by being evaporated from a crucible or by being evaporated by an electron beam. Furthermore, a portion of the plasma may be directed at a sputtering target comprising a metal or a semiconductor to sputter a reactant into the plasma stream. Details of introducing the reactants into the plasma are described in detail in copending application Ser. No. 09/271,655, attorney docket number RD-26,345, to C. Iacovangelo and K. Borst, filed Mar, 17, 1999, incorporated hereby in its entirety by reference.

A variety of different layers may be formed by the arc plasma method on a variety of different substrates. For example, abrasion resistant coatings, stress relief and/or IR or UV-filtering coatings may be formed on substrate materials such as plastic, glass, quartz, ceramic, metal and/or semiconductor. Non-limiting examples of plastic substrates include polycarbonate (PC) (sold under the trademark LEXAN™ by the General Electric Company), polyethercarbonate (PPC), polyethersulfone (PES) (sold under the trademark "Radel®"), polyetherimide (PEI) (sold under the trademark LLTEM™ by the General Electric Company), polycarbonate substrates coated with a silicone hardcoat (sold under the trademark MR7™ and MR10™ by the General Electric Company). The plastic substrates may be used, for example, as vehicle windows.

For example, in order to form an abrasion-resistant layer on a substrate, supply line 112 may be used to supply oxygen into the plasma arc, while supply line 114 may be used to supply a monomeric precursor gas reactant. A siloxane reactant, such as tetramethyldisiloxane (TMDSO), hexamethyldisiloxane (HMDSO) or octamethylcyclotetrasiloxane (D4), may be used to deposit an oxide-enriched polysiloxane layer on a substrate.

Alternatively, organometallics, such as diethyl zinc (DEZ), dimethyl zinc (DMZ), triethyl indium (TEI), trimethyl aluminum (TMA), and triethyl aluminum (TEA), and the like, can be utilized as sources for reactants that are introduced into the plasma stream. These reactants can be introduced into the plasma stream via, for example, supply line 116.

Of course, supply line 114 may be used to supply other reactants to form a plastic or resin layer different from polysiloxane on the substrate. Alternatively, supply lines 114 and 116 may be used to supply gases such as oxygen, nitrogen, and hydrogen, inorganic compounds such as ammonia and silane, organic compounds such as hydrocarbons, organosilanes, oganosiloxanes, organosilazanes, organo-metallic compounds, and vaporized metals to form a metal, semiconductor, metal oxide, metal nitride, or polymer layer, such as Zn, Al, In, Si, Sn, ZnO, $Al_2O_3$, $In_2O_3$, $SiO_2$, $TiO_2Ta_2O_5$, $Nb_2O_3$, $CeO_2$, $SnO_2,Si_3N_4$, silicon oxy-nitride, indium zinc oxide, aluminum zinc oxide, indium tin oxide, diamond-like carbon, or plasma polymerized hydrocarbon, silane or siloxane.

The arc plasma apparatus according to this embodiment of the present invention is particularly useful for depositing automotive glazing layers. It is also useful for depositing a variety of coatings on PC to extend weathering capability in applications such as architectural windows, headlamps, airplane canopies, etc. Further, it is also useful for coating solar cells. In addition, the coated substrates can be utilized in various apparatus display windows such as TV screens, LCD screens, flat panel displays, plasma display screens, computer terminal screens, and glare guards.

EXPERIMENT

Two sets of experiments were performed to analyze the reduced clogging of the injectors according to the preferred embodiment of the present invention. In a first set of experiments, an injector similar in shape to the interchangeable injector 30 shown in FIG. 4 was compared to an injector similar in shape to injector 20 shown in FIG. 2 over the course of a prolonged injection run. In a second set of experiments, an injector similar in shape to the interchangeable injector 30 shown in FIG. 4 was utilized in multiple injection runs in an arc plasma apparatus and the deposition characteristics of the deposited coatings were tested.

In both sets of experiments, an arc plasma generator, similar to that shown in FIG. 8, was used to perform several experimental coating runs. The arc plasma generator included a copper anode separated from three needle-type cathodes of thoriated tungsten by at least one or a series of electrically isolated copper cascade plates. Argon (Ar) was chosen as the plasma gas. With Ar flowing through the bore of the arc generator, a direct current (DC) voltage was applied to the electrodes to generate a plasma.

The plasma expanded through the injection nozzle, similar to the embodiment shown in FIG. 8, into the deposition chamber at a reduced pressure, thus forming a plasma jet.

The substrates coated were PC MR7 sheets, 4"×4" in size. The substrates were cleaned in isopropyl alcohol and dried at 80° C. in flowing nitrogen for at least 12 hours prior to deposition to degas the substrates. Multiple substrates were supported normal to the plasma jet axis in the deposition chamber by a metal support stage. The support stage was located at a distance of about 36 cm from the anode.

Oxygen was introduced into the plasma via a reactant supply line (e.g., line 112) and reactant injector (e.g., 130), such as those shown above in FIG. 8. This setup produced an oxygen/argon plasma.

In the first set of experiments, a first run consisted of a conic-shaped nozzles with straight-hole injectors (see e.g., FIG. 2,) having a 0.047" diameter. These injectors were arranged in a circular injector system, similar to the injector system 60 shown in FIG. 6A. The injectors delivered tetramethyldisiloxane (TMDSO) into the oxygen-argon plasma flow for deposition of an abrasion-resistant coating on the PC substrates. The results showed that the injector orifices were clogged after an accumulated operating time of about 3 hours at a delivery rate of 0.3 slm (standard liter per minute) TMDSO vapor.

A second trial consisted of a nearly identical run using a comparable nozzle, except that the injectors included recessed portions having divergent inner walls and protruding tips (see e.g., FIG. 4, injector 30). In this run first portion 6 had a 0.047" orifice diameter and a 0.095" length, second portion 8 had a divergence angle of about 60 degrees from a cylindrical axis and a length of 0.015", the third portion 10 had a diameter of 0.102" and a length of 0.075", and a 0.05" injector tip protrusion into the plasma flow, wherein the diameter of the outer portion was 0.18". After 8 hours of continuous operation under similar conditions as those described above, the injectors in the second run showed no discernible clogging. The deposition runs were then continued for an accumulated total of 13 hours operating time without discernible clogging. Thus the nozzle injectors having an injector system according to the preferred aspects of the present invention were continuously operated over four times longer without clogging than the straight hole injectors.

In the second set of experiments, TMDSO-based coatings were deposited on three 4"×4" PC MR7 sheet under conditions similar to those described above. In this set of experiments a nozzle having multiple injectors with recessed portions and protruding tips as described above was utilized. Two sets of samples were generated before (first run) and after (second run) an 8-hr continuous operation of the nozzle-injector. The quality of the deposited coatings was measured with respect to thickness, clarity, Taber abrasion resistance, and tape adhesion. The thickness was measured by using a profilometer (Dektak IIA) at five different pre-masked masked locations on the substrate. The clarity was measured in terms of "haze," which is a well known measure of optical clarity of windows. Haze measurements were made using a Gardner model XL-835 calorimeter. Taber abrasion resistance was measured by taking haze readings of the sample before and after being abraded on a Gardner Taber abraser model 5130 for 1,000 cycles with CS-10F wheels weighed at 500 g per wheel. Each sample is measured at four different locations equally spaced along the Taber track. The haze increase after Taber is quoted as the Taber abrasion resistance. The smaller the haze increase, the better the Taber abrasion resistance. Tape adhesion was measured by cutting into the coating with a cross hatch cutter after deposition, soaking the sample in water at 65 C for up to 14 days, and, at 3–4 day intervals, testing the coating by applying tape to the coating then pulling the tape off. Resulted are ranked from 0B to 5B, with 0B being>65% peel-off and 5B being no detectable peel-off.

The results given in Table 1 show that the coating properties using the injector system according to the preferred aspect of the present invention are practically the same regarding thickness, clarity, Taber abrasion resistance, and tape adhesion before and after 8 hours of continuous use of the injectors.

TABLE 1

Performance of coatings generated before and after the 8 hour operation of the nozzle-injector

| Nozzle-injector condition | Coating thickness (micron) | | Initial haze (%) | | Taber haze increase (%) | | Tape test/water soak | |
|---|---|---|---|---|---|---|---|---|
| | vg | tDev | rg | tDev | vg | tDev | day | 14 day |
| Clean | .7 | .33 | .76 | .14 | .1 | .8 | B | 5B |
| After 8 hr | .4 | .31 | .74 | .13 | .4 | .9 | B | 5B |

In addition, the same nozzle-injector was also tested for the delivery of a different reagent, octamethylcyclotetrasiloxane (D4) at a rate of 0.2 slm D4 vapor into oxygen-argon plasma. No sign of clogging was observed after 8 hours of continuous operation.

While the invention has been described in detail and with reference to specific embodiments thereof, it will be apparent to one skilled in the art that various changes and modifications can be made therein without departing from the scope of the invention.

What is claimed is:

1. An injector system for injecting a fluid reagent into a plasma stream, comprising:
   a base containing an injector and having a first base surface and a second base surface, comprising:
      a first inner wall extending from the first base surface into the base and defining a first channel portion for restricting a flow of the fluid reagent and having a shape such that the first inner wall of the first channel portion is parallel to a first axis, wherein the first channel portion has a first diameter; and
      a second inner wall defining a second channel portion in fluid communication with the first channel portion and having a recessed portion such that the second inner wall of the second channel portion diverges from the first axis at a predetermined angle, wherein the second channel portion has a second diameter that is greater than the first diameter, and wherein the second channel portion directs the fluid reagent into a plasma stream flowing past the second base surface and reduces a buildup of a clogging layer on the second inner wall of the second channel portion over a period of use.

2. The injector system according to claim 1, wherein the predetermined angle is from about 20 degrees to about 70 degrees.

3. The injector system according to claim 1, wherein the injector is integrally formed in the injector base, the injector comprising:

an entrance aperture formed in a first surface of the injector base; and an exit aperture formed in a second surface of the injector base.

4. The injector system according to claim 3, wherein the injector walls and injector base comprise a material selected from the group consisting of metals, alloys, and ceramics, the material withstanding high operating temperatures without melting.

5. The injector system according to claim 4, wherein the material comprises stainless steel.

6. The injector system according to claim 1, wherein the injector is removable from the injector base.

7. The injector system according to claim 6, wherein the injector further comprises a body having a threaded outer wall and the injector base comprises a threaded receptacle for receiving the threaded injector body.

8. The injector system according to claim 1, the injector further comprising:
a tip portion that protrudes above a surface of the base into the plasma, wherein the tip portion has a diameter greater than a diameter of the first channel portion.

9. The injector system according to claim 8, wherein the tip portion extends above the surface of the base a distance of about 0.001 inches to about 0.3 inches.

10. The injector system of claim 1, further comprising a third inner wall parallel to the first axis and defining a third channel portion in fluid communication with the second channel portion, the third channel portion having a diameter greater than that of the first channel portion, wherein the third channel portion reduces a buildup of the clogging layer for a period of use comprising greater than eight hours of continuous flow.

11. The injector system according to claim 1, wherein the fluid comprises a material selected from the group consisting of inorganic gases, inorganic compound gases, organic compound gases, and organo-metallic compound gases.

12. The injector system according to claim 11, wherein the material is selected from the group of inorganic gases consisting of oxygen, nitrogen, hydrogen, zinc, aluminum, indium, and compounds thereof.

13. The injector system according to claim 11, wherein the material is selected from the group of inorganic compound gases consisting of ammonia, silane, and compounds thereof.

14. The injector system according to claim 11, wherein the material is selected from the group of organic compound gases consisting of hydrocarbons, organosilanes, oganosiloxanes, and organosilazanes, and compounds thereof.

15. The injector system according to claim 14, wherein the material is selected from the group of gases consisting of methane, butadiene, ethylbenzene, hexamethyldisilane, tetramethyldisilane, vinyltriethylsilane, hexamethyldisioxane, tetramethyldisiloxane, octamethylcyclotetrasiloxane, hexamethyldisilazane, and compounds thereof.

16. The injector system according to claim 11, wherein the material is selected from the group of organo-metallic compound gases consisting of diethylzine, dimethylzinc, and compounds thereof.

17. The injector system according to claim 1, wherein the first channel portion has a first diameter, wherein the recessed portion is defined by an inner wall that diverges from the first axis at a 90 degree angle, and wherein am inner wall defining the second channel portion is parallel to the first axis and has a second diameter greater than the first diameter.

18. The injector system according to claim 1, comprising:
a fluid supply channel formed inside a body of the injector system; and
a plurality of injectors of claim 1 disposed in the body and in fluid communication with the fluid supply channel.

19. The injector system according to claim 18, wherein each of the injectors further comprises:
a tip portion that protrudes above a surface of the base into the plasma.

20. The injector system according to claim 18, further comprising:
a fluid supply line in fluid communication with the fluid supply channel, wherein the fluid supply channel is configured in a ring shape, and wherein the injectors disposed in the fluid supply channel are evenly distributed around a circumference of the fluid supply channel.

21. The injector system according to claim 18, further comprising:
a fluid supply line in fluid communication with the fluid supply channel, wherein the fluid supply channel is configured in a ring shape, and wherein the injectors disposed in the fluid supply channel are unevenly distributed around a circumference of the fluid supply channel, such that a greater number of the injectors are located on a side of the fluid supply channel that is further from the fluid supply line.

22. The injector system according to claim 18, further comprising:
a fluid supply line in fluid communication with the fluid supply channel, wherein the fluid supply channel is configured in a semi-circular arc shape.

23. The injector system according to claim 18, further comprising:
a fluid supply line in fluid communication with the fluid supply channel, wherein the fluid supply channel is configured in a cylindrical shape.

24. The injector system according to claim 18, wherein the predetermined angle is from about 20 degrees to about 70 degrees.

25. The injector system according to claim 18, wherein the fluid comprises a material selected from the group consisting of inorganic gases, inorganic compound gases, organic compound gases, and organo-metallic compound gases.

26. The injector system according to claim 25, wherein the material is selected from the group of inorganic gases consisting of oxygen, nitrogen, hydrogen, zinc, aluminum, indium, and compounds thereof.

27. The Injector system according to claim 25, wherein the material is selected from the group of inorganic compound gases consisting of ammonia, silane, and compounds thereof.

28. The injector system according to claim 25, wherein the material is selected from the group of organic compound gases consisting of hydrocarbons, organosilanes, oganosiloxanes, and organosilazanes, and compounds thereof.

29. The injector system according to claim 28, wherein the material is selected from the group of gases consisting of methane, butadiene, ethylbenzene, hexamethyldisilane, tetramethyldisilane, vinyltriethylsilane, hexamethyldisioxane, tetramethyldisiloxane, octamethylcyclotetrasiloxane, hexamethyldisilazane, and compounds thereof.

30. The injector system according to claim 25, wherein the material is selected from the group of organo-metallic compound gases consisting of diethylzinc, dimethylzinc, and compounds thereof.

31. An apparatus for coating a substrate, comprising:
a plasma generator having an anode and a cathode capable of forming an arc plasma that travels in a plasma stream toward a substrate;
a deposition chamber containing a substrate mount; and
a first injector system located between the anode and the substrate mount for introducing a first reactant into the plasma, the first injector system comprising an injector that includes:
a first channel portion for restricting a flow of the first reactant and having a shape such that inner walls of the first channel portion are parallel to a first axis, wherein the first channel portion has a first diameter, and
a second channel portion in fluid communication with the first channel portion and having a recessed portion such that inner walls of the second channel portion diverge from the first axis at a predetermined angle, wherein the second channel portion has a second diameter that is greater than the first diameter, and wherein the second channel portion directs the fluid reagent into the plasma stream and reduces a buildup of a clogging layer on the inner walls of the second channel portion over a period of use.

32. The apparatus according to claim 31, wherein the injector further comprises:
a tip portion that protrudes above a surface of an injector base into the plasma.

33. The apparatus according to claim 32, further comprising;
an anode having a plasma channel; and
a nozzle coupled to the anode, having a nozzle channel extending from the anode, the nozzle channel adapted to allow a flow of the plasma towards the substrate, the nozzle further comprising the first injector system to provide for the introduction of the first reactant into the plasma.

34. The apparatus according to claim 33, wherein the first injector system comprises:
a fluid supply channel formed inside a body of the first injector system; and
a plurality of injectors disposed in the body and in fluid communication with the fluid supply channel, each of the injectors comprising
a first channel portion for restricting a flow of the first reactant and being cylindrical in shape such that inner walls of the first channel portion are parallel to a cylindrical axis,
a second channel portion in fluid communication with the first channel portion and having a recessed portion such that inner walls of the second channel portion diverge from the cylindrical axis at a predetermined angle, the second channel potion reducing a buildup of a clogging layer on the inner walls of the second channel portion over a period of use, and
a tip portion that protrudes above a surface of an injector base into the plasma.

35. The apparatus according to claim 34, further comprising:
a fluid supply line in fluid communication with the fluid supply channel, wherein the fluid supply channel is configured in a ring shape, and wherein the injectors are disposed in the fluid supply channel and are evenly distributed around a circumference of the fluid supply channel.

36. The apparatus according to claim 34, further comprising:
a fluid supply line in fluid communication with the fluid supply channel, wherein the fluid supply channel is configured in a ring shape, and wherein the injectors disposed in the fluid supply channel are unevenly distributed around a circumference of the fluid supply channel, such that a greater number of the injectors are located on a side of the fluid supply channel that is further from the fluid supply line.

37. The apparatus according to claim 34, further comprising:
a fluid supply line in fluid communication with the fluid supply channel, wherein the fluid supply channel is configured in a semi-circular shape.

38. The apparatus according to claim 34, further comprising:
a second injector system in the nozzle for introducing a second reactant into the plasma.

39. The apparatus according to claim 31, wherein a location of the first injector system corresponds to a desired chemical stoichiometry and structure of a coating comprising the first reactant to be coated onto a surface of a substrate by the plasma.

40. The apparatus according to claim 31, wherein the first reactant comprises a material selected from the group consisting of inorganic gases, inorganic compound gases, organic compound gases, and organo-metallic compound gases.

41. The apparatus according to claim 40, wherein the material is selected from the group of inorganic gases consisting of oxygen, nitrogen, hydrogen, zinc, aluminum, indium, and compounds thereof.

42. The apparatus according to claim 40, wherein the material is selected from the group of inorganic compound gases consisting of ammonia, silane, and compounds thereof.

43. The apparatus according to claim 40, wherein the material is selected from the group of organic compound gases consisting of hydrocarbons, organosilanes, oganosiloxanes, and organosilazanes, and compounds thereof.

44. The apparatus according to claim 43, wherein the material is selected from the group of gases consisting of methane, butadiene, ethylbenzene, hexamethyldisilane, tetramethyldisilane, vinyltriethylsilane, hexamethyldisioxane, tetramethyldisiloxane, octamethylcyclotetrasiloxane, hexamethyldisilazane, and compounds thereof.

45. The apparatus according to claim 40, wherein the material is selected from the group of organo-metallic compound gases consisting of diethylzinc, dimethylzinc, and compounds thereof.

46. A device for coating a substrate, comprising:
means for generating a plasma stream;
means for supplying a first reactant to an injector means for introducing the first reactant into the plasma stream, the injector means comprising means for directing the first reactant into the plasma stream and means for reducing a clogging of the first reactant on inner walls of the injector means, wherein the means for directing the first reactant into the plasma stream comprises a first inner wall extending from a first surface into a base and defining a first channel portion for restricting a flow of the first reactant, the first portion having a first diameter and a shape such that the first inner wall of the first channel portion is parallel to a first axis; and a second inner wall defining a second channel portion in fluid communication with the first channel portion, the second portion having a second diameter that is greater than the first diameter and a recessed portion such that the second inner wall of the second channel portion diverges from the first axis at a predetermined angle; and means for depositing a coating containing the first reactant on a surface of the substrate.

47. The device according to claim 46, injector means further comprising:

means for introducing the first reactant into the plasma such that the coating is deposited in a uniform manner on all regions of the substrate surface being coated.

* * * * *